US006843687B2

(12) United States Patent
McGowan et al.

(10) Patent No.: US 6,843,687 B2
(45) Date of Patent: Jan. 18, 2005

(54) PSEUDO-COAXIAL WAFER ASSEMBLY FOR CONNECTOR

(75) Inventors: Daniel B. McGowan, Naperville, IL (US); Brian O'Malley, Naperville, IL (US); Kent E. Regnier, Lombard, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/789,742

(22) Filed: Feb. 27, 2004

(65) Prior Publication Data

US 2004/0171305 A1 Sep. 2, 2004

Related U.S. Application Data

(60) Provisional application No. 60/450,835, filed on Feb. 27, 2003.

(51) Int. Cl.[7] .............................................. H10R 13/648

(52) U.S. Cl. ...................................................... 439/608

(58) Field of Search ................................ 439/608, 108, 439/101, 607, 571, 540, 1, 79, 620, 931, 579, 701, 65

(56) References Cited

U.S. PATENT DOCUMENTS

| | | | | | |
|---|---|---|---|---|---|
| 5,605,476 | A | * | 2/1997 | McNamara et al. | 439/608 |
| 5,664,968 | A | * | 9/1997 | Mickievicz | 439/608 |
| 5,702,258 | A | * | 12/1997 | Provencher et al. | 439/79 |
| 5,743,765 | A | * | 4/1998 | Andrews et al. | 439/608 |
| 5,795,191 | A | * | 8/1998 | Preputnick et al. | 439/608 |
| 5,842,872 | A | * | 12/1998 | Hosler et al. | 439/63 |
| RE36,065 | E | * | 1/1999 | Andrews et al. | 439/608 |
| 5,904,594 | A | * | 5/1999 | Longueville et al. | 439/608 |
| 6,364,710 | B1 | * | 4/2002 | Billman et al. | 439/608 |
| 6,435,914 | B1 | * | 8/2002 | Billman | 439/608 |
| 6,491,545 | B1 | * | 12/2002 | Spiegel et al. | 439/579 |
| 6,517,360 | B1 | * | 2/2003 | Cohen | 439/65 |
| 6,540,558 | B1 | * | 4/2003 | Paagman | 439/608 |
| 6,551,140 | B2 | * | 4/2003 | Billman et al. | 439/608 |
| 6,607,401 | B1 | * | 8/2003 | Weaver et al. | 439/608 |

* cited by examiner

*Primary Examiner*—Gary Paumen
*Assistant Examiner*—Phuongchi Nguyen
(74) *Attorney, Agent, or Firm*—Thomas D. Paulius

(57) ABSTRACT

A high-density connector utilizes a plurality of terminal assemblies that are assembled together into a block, or single unit, to form a connector. Each terminal assembly of the connector utilizes a plurality of conductive terminals having contact portions for mating with an opposing connector, tail portions for mounting to a circuit substrate and body portions held within an insulative body portion of the assembly. The body portions are supported within a housing in the form of a wafer which is plated with a conductive material so as to provide an all encompassing ground structure that surrounds the terminals and their insulative supporting terminal assemblies. In this manner a reference ground is provided around each signal terminal between its contact and tail portions that emulates a coaxial cable. The tails of the terminals and the ground structure have wide body portions with narrow contact portions to promote wicking of solder onto the tails for establishing a reliable solder mounting of the connector to a circuit board.

20 Claims, 15 Drawing Sheets

FIG. 10
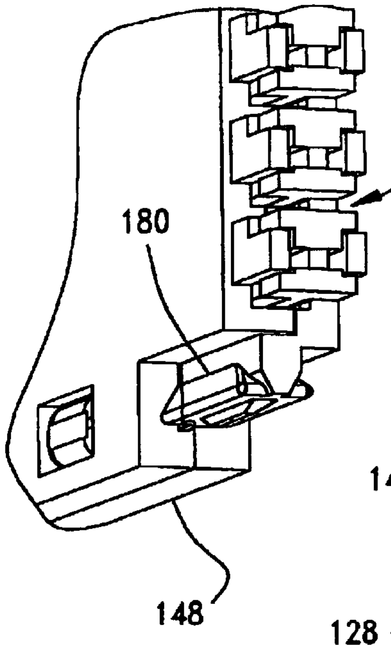
FIG. 11
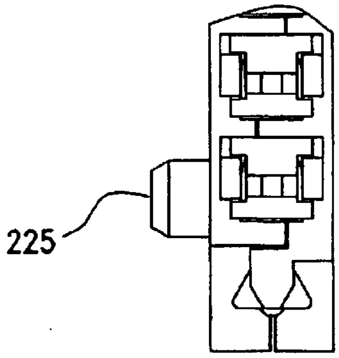
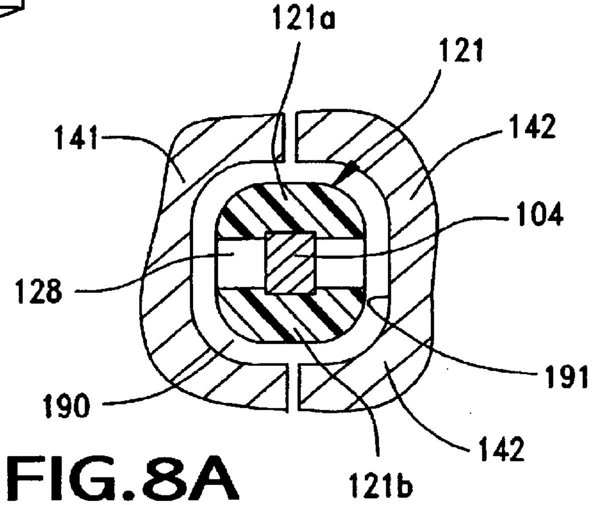
FIG. 8A
FIG. 8
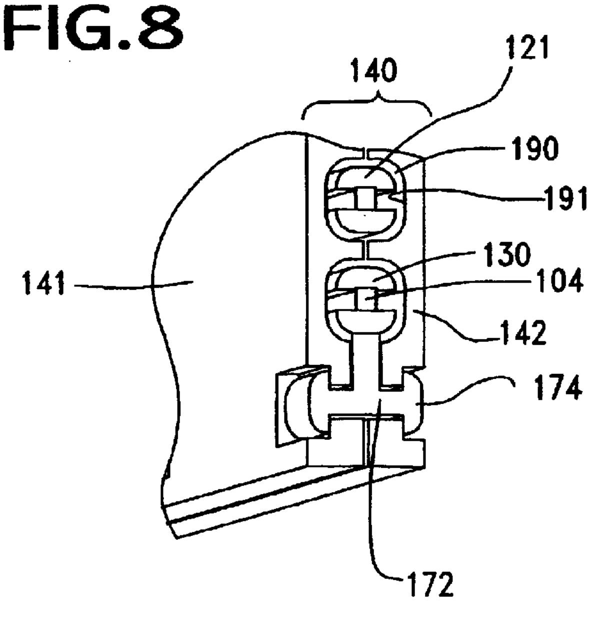
FIG. 9
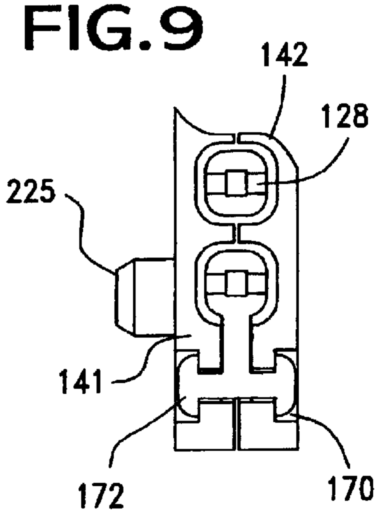

PSEUDO-COAXIAL WAFER ASSEMBLY FOR CONNECTOR

REFERENCE TO RELATED APPLICATIONS

The present application claims the benefit of U.S. provisional Patent Application No. 60/450,835, filed Feb. 27, 2003.

BACKGROUND OF THE INVENTION

The present invention relates generally to high density connectors and, more particularly, to high density connectors that are used to connect two printed circuit boards together in orthogonal and other arrangements.

High-density interconnect systems are used in numerous data communication applications, one such application being in network servers and routers. In many of these applications, the interconnect systems include male and female connectors that are mounted to different circuit boards, such as in the manner of conventional right-angle connectors, in which the two circuit boards are oriented at 90° with respect to each other, so that two edges of the circuit boards abut each other. Servers and routers require that the two circuit boards be joined together.

Today's electronic technology demands high speed signal transmission to compete in the global electronic marketplace. Where a few years ago, signal transmission speeds of 1 Gigahertz were thought fast, today's designers are targeting 6, 10 and 12 Gigahertz transmission speeds as the future norm. Prior high-density board to board connectors utilized a plurality of discrete wafers that housed conductive terminals. Metal shields are provided between these wafers.

These shields were stamped and formed from metal and their stamping and forming is complex and expensive. It also requires that the insulative housing be modified to accept and hold portions of the intervening shields. Furthermore, it is difficult, if not impossible, to entirely, or at least substantially, surround each terminal of the wafer with the metal shield.

A need therefore exists for a high-density interconnector system that operates at high signal transmission speeds and which overcomes the aforementioned disadvantages. Coaxial cable, in which a signal conductor is completely surrounded by an outer ground, can carry signals at high speeds, but no one has incorporated such technology into a wafer-style connector assembly.

SUMMARY OF THE INVENTION

The present invention is directed to an improved high speed interconnection assembly that has a structure that emulates the structure of a coaxial cable.

Accordingly, it is a general object of the present invention to provide an interconnection system that utilizes a pair of connectors, each mounted near an edge of a respective circuit board wherein at least one of the connectors is formed from a plurality of individual subassemblies in the form of wafers supporting a plurality of conductive terminals, and in which the are flanked by a ground structure.

Yet still another object of the present invention is to provide a high-density connector for board to board connections in single-ended signal applications, wherein the connector includes a plurality of terminal assemblies assembled together into a single unit, each terminal assembly including a plurality of conductive terminals, the terminals including signal terminals, the terminals being supported on insulative skeletal supports that are held together, the terminal assemblies further including ground members formed as part of the assemblies, which flank individual signal terminals of the assemblies.

Another object of the present invention is to provide a high-density connector that has a plurality of conductive terminals supported on insulative support and wherein are surrounded by ground structures, the ground structures being formed as distinct body portions that enclose the terminals and their supports, the ground structures being formed as half-housings which are joined together to form a conductive wafer that substantially surrounds the terminals and support structure.

A still further object of the present invention is to provide a wafer construction of the style set forth above wherein the ground structure half-housings are formed from an insulative material that is plated with a conductive material so that the entire wafer housing is conductive.

Still yet another object of the present invention is to provide a high speed connector having a plastic shell housing a plurality of conductive terminals, the terminals having surface mounting feet portions that project outwardly along a mounting edge of the shell, the shell being coated with a conductive material to render it electrically conductive so as to serve as a ground for the terminal supported in the shell, the shell further having a plurality of surface mount members integrally formed therewith for connecting the shell to a plurality of contact pads of a circuit board, the surface mount members having a base portion with a narrow contact portion that promotes wicking of solder onto the surface mount member during attachment thereof to the circuit board.

Another object of the present invention is to provide the shell mentioned above with the surface mount members spaced apart from each other along the mounting edge of the shell along both sides thereof and projecting slightly outwardly from the shell mounting edge such that the terminal surface mounting feet are arranged in a line between two rows of the shell surface mount members, the shell having a plurality of recesses formed in its mounting edge that are interposed between adjacent surface mount members, the recesses of one shell accommodating the projecting shell surface mount members of an adjacent shell to form a series of ground connections between the shell and the circuit board that surround the line of terminal surface mount feet.

The present invention accomplishes the aforementioned and other objects by way of its novel and unique structure.

In one principal aspect of the present invention, a flexural high density connector assembly is provided whose primary purpose is to connect together two orthogonally-oriented circuit boards. The assembly includes a plug connector mounted to a first circuit board and a receptacle connector mounted to a second circuit board.

In this regard, and in another principal aspect of the present invention, one of the connectors, preferably the plug connector includes a plurality of terminal assemblies which are assembled together from four different parts and which include a plurality of single-ended terminals that are encompassed by a ground structure set. The terminals are supported on dielectric supports and have tail portions extending along one side thereof which mate with a circuit board, and contact portions that extend from another side thereof housing for mating with terminals of an opposing connector. Body portions of the terminals interconnect the contact and tail portions together and are supported by the dielectric supports.

The dielectric supports have the same configuration and general spacing as the terminals and are molded over the terminals to form a terminal assembly. Once molded, the resulting assembly has the appearance of a skeleton or skeletal structure. Slots are preferably provided lengthwise in the skeletal support structure for impedance tuning of the terminal assembly. In order to emulate a coaxial cable, the skeletal support structure is contained within a housing that has a thin, wafer-like appearance.

The housing is formed from two interengaging parts that take the form of half-housings. Each such half-housing has a plurality of grooves, or recesses, formed in its inner face. The skeletal structure fits within these grooves, with each groove receiving the extent of a single terminal. When these half-housings are applied together over the skeletal structure, each terminal thereof is housed completely within a single groove and is substantially surrounded by the half housings. In order to provide an encompassing ground, the half-housings are made conductive, preferably by plating with, or otherwise depositing a conductive material on all their exposed surfaces. In this manner, a reference ground is provided in the entire extent of the signal terminals from the tail to the contact portions thereof.

In another principal aspect of the present invention, the signal terminal assemblies are assembled as units in the form of wafers, which may be separately removed from the entire connector in order to facilitate the removal and replacement thereof. Each signal terminal assembly is supported on a single wafer.

In yet another aspect of the present invention, an opposing connector is provided to engage the plug connector contact portions. This connector has a plurality of conductive female contact terminals supported within exterior housings and these contacts receive the plug connector contact portions that take the form of pins that extend out from their supporting wafers, in a cantilevered fashion.

Cover members may be provided for the plug connector which are is slotted to receive individual wafer housings within each of the slots in order to align the front ends of the receptacle connector wafer housings. These slots also space the wafer housings apart a desired spacing.

In another aspect of the present invention, the connector assembly includes a pair of mating connectors and each connector includes a housing that receives and holds together a plurality of individual conductive components, one of which is preferably in the form of an assembly of wafers, and the other of which is preferably in the form of conductive terminals arranged in a housing. Each wafer may include signal terminals with conductive contact portions, tail portions and body portions that interconnect the contact and tail portions together, which are at least partially enclosed by an insulative covering. The two insulative coverings are held within a two-piece ground housing that cooperatively forms a single connector wafer, with all of the connector wafers in the plug connector being of the same type.

The terminals of this receptacle connector are housed within a member in the form of an assembled pin header connector component. This member has its conductive terminals held within a plurality of passages and the passage walls are also preferably plated with a conductive material so that as a unit, the passages and their components provide a ground structure that entirely encompasses the conductive terminals. The connector also includes insulating members to insulate and isolate the terminals from contact with the surrounding ground structure. The male projecting pins of the plug connector are received within the passages and a coaxial-like structure is provided that links together two circuit boards.

In still yet another principal aspect of the present invention, the terminals of the connector assembly are provided with a unique style of surface mounting feet or tails for attaching the terminals to a circuit board. These tails have wide body portions that run longitudinally along a mounting edge disposed on the bottom of each assembled wafer, and the body portion reduce in size down to narrow portions which are set off from the body portions by notches, or re-entrant portions. These narrow portions make contact with solder paste deposited on circuit board contact pads and the difference in size promotes wicking of the solder up from the contact board onto the body portion to establish a reliable solder joint with the circuit board. The housing halves that make up each wafer are also preferably provided with similarly configured surface mount feet.

The terminal surface mounting feet are arranged in a line that is generally down the center of the bottom of the mounting surface of the wafer, while the wafer surface mounting feet are arranged in two lines that flank the terminals and extend along the side edges of the bottom of the wafer mounting surface. The wafers also preferably include recesses formed along the edges of the bottom of the wafer mounting surface and these recesses are interposed between pairs of the wafer surface mount feet, the recesses of one shell accommodating the projecting surface mount feet of adjacent wafers to form a series of ground connections between the wafers and the circuit board that surround the line of terminal surface mount feet.

These and other objects, features and advantages of the present invention will be clearly understood through a consideration of the following detailed description.

BRIEF DESCRIPTION OF THE DRAWINGS

FIG. 8 is an enlarged, angled end view of the front end of the wafer of FIGS. 1 and 2 illustrating the manner in which the inner terminal support structure assists in holding the wafer half-housings together;

FIG. 8A is an enlarged sectional view of one of the terminals of the assembly of FIG. 8, illustrating the coaxial-like structure of the present invention;

FIG. 9 is the same view as FIG. 8, but taken from the front face thereof;

FIG. 10 is an enlarged, angled bottom of the bottom edge of the wafer of FIGS. 1 and 2 illustrating the manner of engagement among the skeletal support structure of the two plated wafer half-housings;

FIG. 11 is the same view as FIG. 10 but taken from the end thereof;

DETAILED DESCRIPTION OF THE PREFERRED EMBODIMENTS

Figure 1:
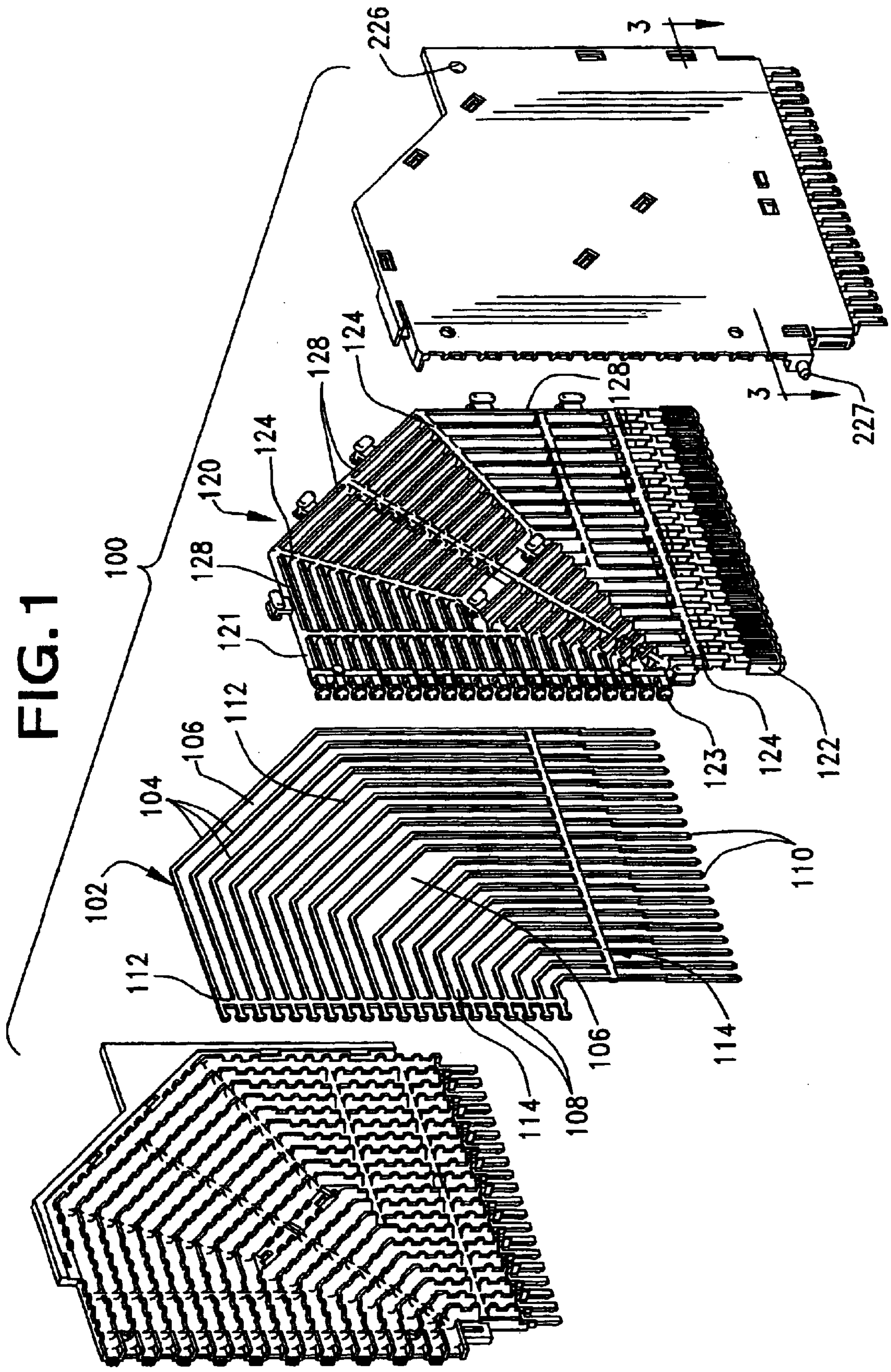
FIG. 1 is an exploded perspective view of a plug connector wafer constructed in accordance with the principles of the present invention.

FIG. 1 illustrates, in an exploded format, a plug connector component that takes the form of a wafer 100 which is constructed in accordance with the principles of the present invention. The connector component 100 includes a terminal lead frame 102 that supports an arrangement of individual terminals 104 which are separated by intervening spaces 106. The terminals 104 are shown in an upside-down arrangement in FIGS. 1 and 2 with their tail portions 108 shown extending horizontally and their mating, or contact portions 110, shown vertically and extending downwardly in the drawings. The tail portions 108 and contact portions 110 are interconnected by intervening body portions 112 which are interconnected, as a frame, by transverse strips 114 which are separated from the body portions 112 by singulation during assembly.

The terminals 104 are supported within an insulative support structure 120 that is molded onto and over portions of the terminals 104. This structure 120 may be considered as defining a skeletal framework 121 in which an electrically insulative material, preferably a dielectric material, is applied to the individual terminals 104 and which extends lengthwise of the terminals 104. Portions 122, 123 of this skeletal framework 121 extend respectively over the terminal tail portions 108 and the terminal contact portion 110. The individual extents of the skeletal framework 121 may be interconnected for stability and ease in molding by transverse extents 124 that are spaced at selected intervals between opposing ends of the framework. As used herein, “ends” refers to the mating and tail edges of the entire assembly 100.

The skeletal framework 121 may be preferably provided with slots 128 that follow the extents of the individual terminals and which open to the terminal body portions 112. These slots, or openings, provide an air gap, or pocket, that is interposed between the exposed surfaces of the terminals 102 and the housing portions of the terminal assembly wafer, shown best in FIGS. 8, 8*a* & 9. The skeletal frame 121 itself may be held within the wafer housing in a manner where much of it is spaced away from the outer conductive ground housing structure, as shown in FIG. 8, where an air gap 190 is present between the inner surfaces 191 of the housing halve grooves and the terminals 104 and the skeletal frame 121.

Once the insulative skeletal frame 121 is applied to the terminal lead frame, the transverse connecting strips 114 may be singulated (i.e., removed) to electrically isolate individual terminals from each other. The resulting structure defines a terminal assembly 130 as shown in the center portion of FIG. 2. This assembly 130 is then inserted into an exterior housing 140 that is formed from two opposing and interengaging halves 141, 142 that cooperate to form the exterior housing 140 that takes the form of a thin wafer 145.

The wafer 145 has a plurality of sides, or edges, 146–151. Two of these edges 146, 147 are adjacent each other and respectively define the mating and mounting edges of the wafer 145.

Figure 3:
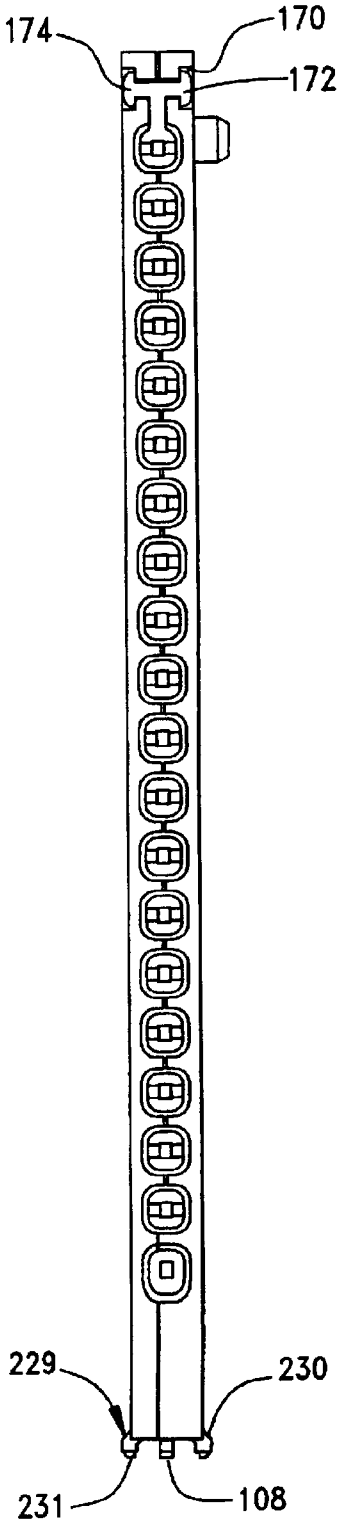
FIG. 3 is a sectional view of the wafer of FIG. 1 in an assembled state and taken along line 3—3 thereof.
Figure 4:
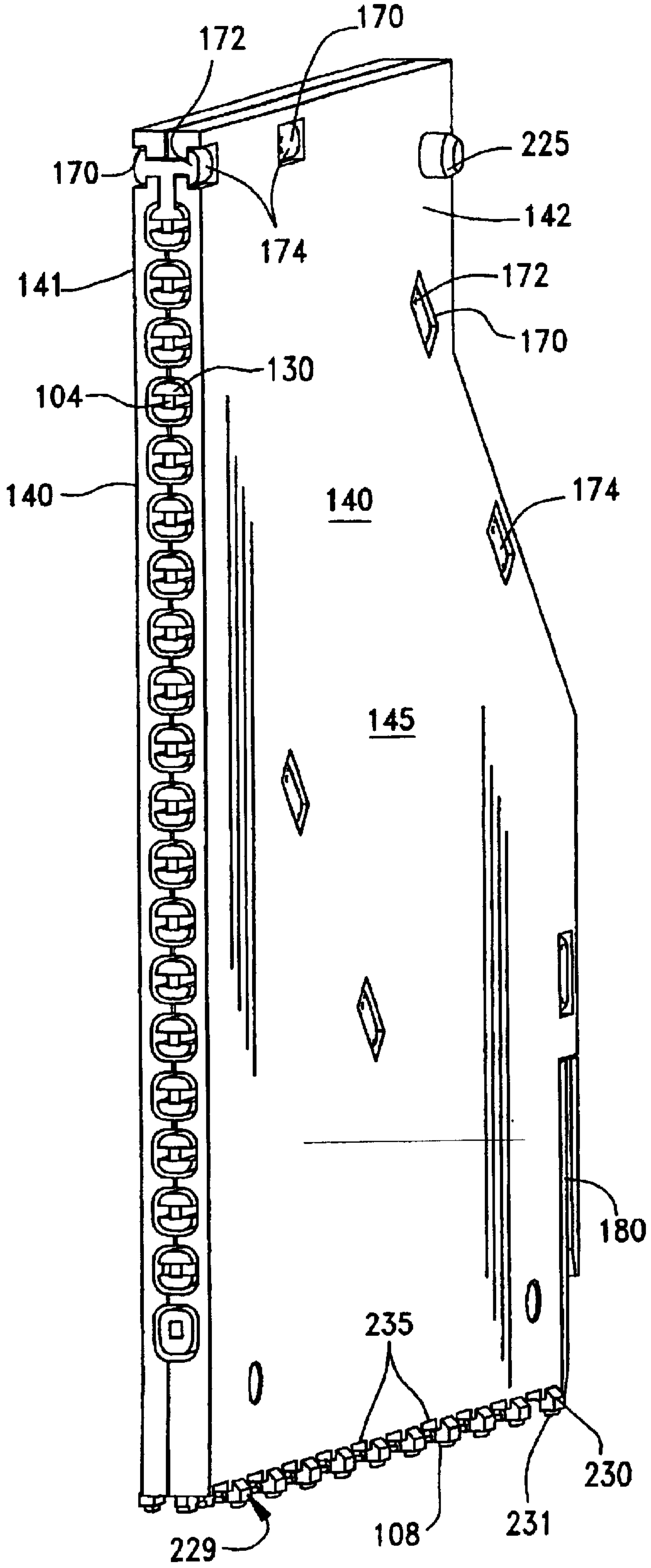
FIG. 4 is an angled frontal view of the assembled wafer of FIG. 3.
Figure 5:
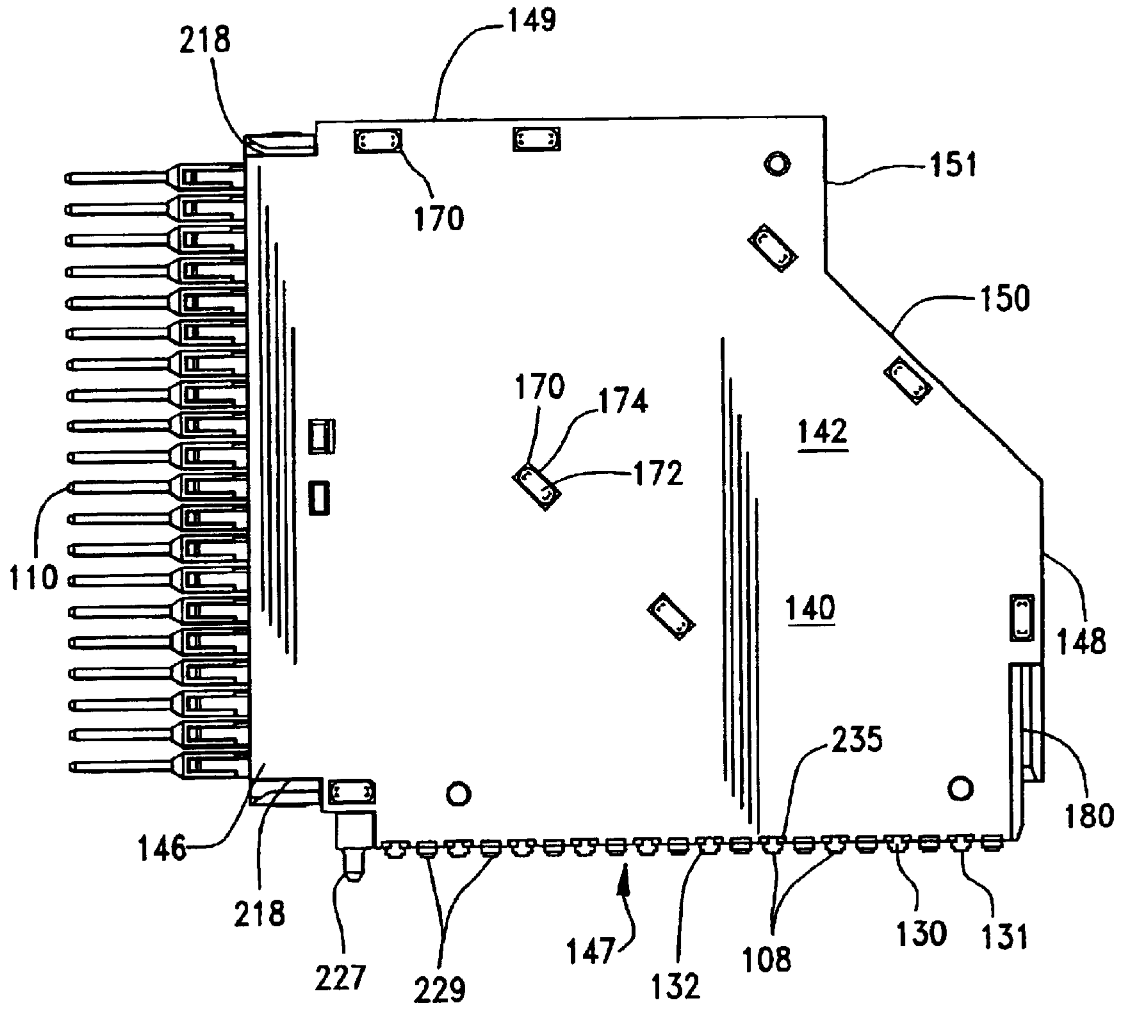
FIG. 5 is a side elevational view of the wafer of FIGS. 3 and 4 with the contact portions inserted in place thereon.

Each of the housing halves 141, 142 is provided as shown, with a series of grooves, or recesses 155 that are separated from each other by a series of intervening walls 156. These grooves 155 define channels 158, each of which receives a single terminal extent of the terminal assembly 130. In an important aspect of the present invention, substantially all, and preferably all of the exposed surfaces 160, 161 are covered with a conductive material such as a metal. This covering is best achieved by the plating of the housing halves 141, 142 or otherwise depositing a conductive material thereon. Due to this conductive plating, the entire wafer housing 140 acts as an exterior ground to the inner signal terminals 104, throughout the extent of the wafer housing 140 from its mounting edge 147 to its mating edge 146. As seen in FIGS. 3 and 4 where the mating portions 110 of the terminals 104 have been removed for clarity, the terminal 104 is partially encompassed by its insulative support 120, which in turn is encompassed by the exterior conductive wafer housing. The exterior wafer housings are connected to ground on a circuit board 200 (FIG. 6) so as to electrically ground the entire wafer housing 140.

As set forth above, the structure of the present invention gives a coaxial nature to each terminal of the assemblies. This coaxial nature may be shown best in FIG. 8A, where it can be seen that each conductive terminal 104 has an insulative skeletal framework 121 applied to it. This framework is bifurcated in some areas, where distinct top and bottom portions 121*a*, 121*b* thereof are separated by the slots 128 that expose the outer surfaces of the terminals 104 to air. The top and bottom portions 121*a*, 121*b* provide an insulator that partially covers the terminal 104, in a manner similar to inner insulation found in a coaxial cable. A normal coaxial cable then has its insulating layer surrounded by a conductive shield, which is usually formed from a braided wire.

In the structure of the present invention, such a shield is formed by plating the exterior wafer housing 140 with a conductive material. The exterior housing has two halves 141 and 142, with recesses formed therein that receive the terminal-framework as shown in FIG. 8A. An air gap 190 may not be provided between the housing halves 141, 142 and the top and bottom portions of skeletal framework 121*a,* 121*b*. The inner edges of the housing halves may abut each other, or they may be separated by an intervening gap which will largely be controlled by manufacturing tolerances. As mentioned elsewhere in this description, engagement members are formed on the housing halves 141, 142 to provided effective electrical contact between the two halves 141, 142 so that the entire housing 140 may act as a single ground for all of the terminals 104 contained therein.

Figure 2:
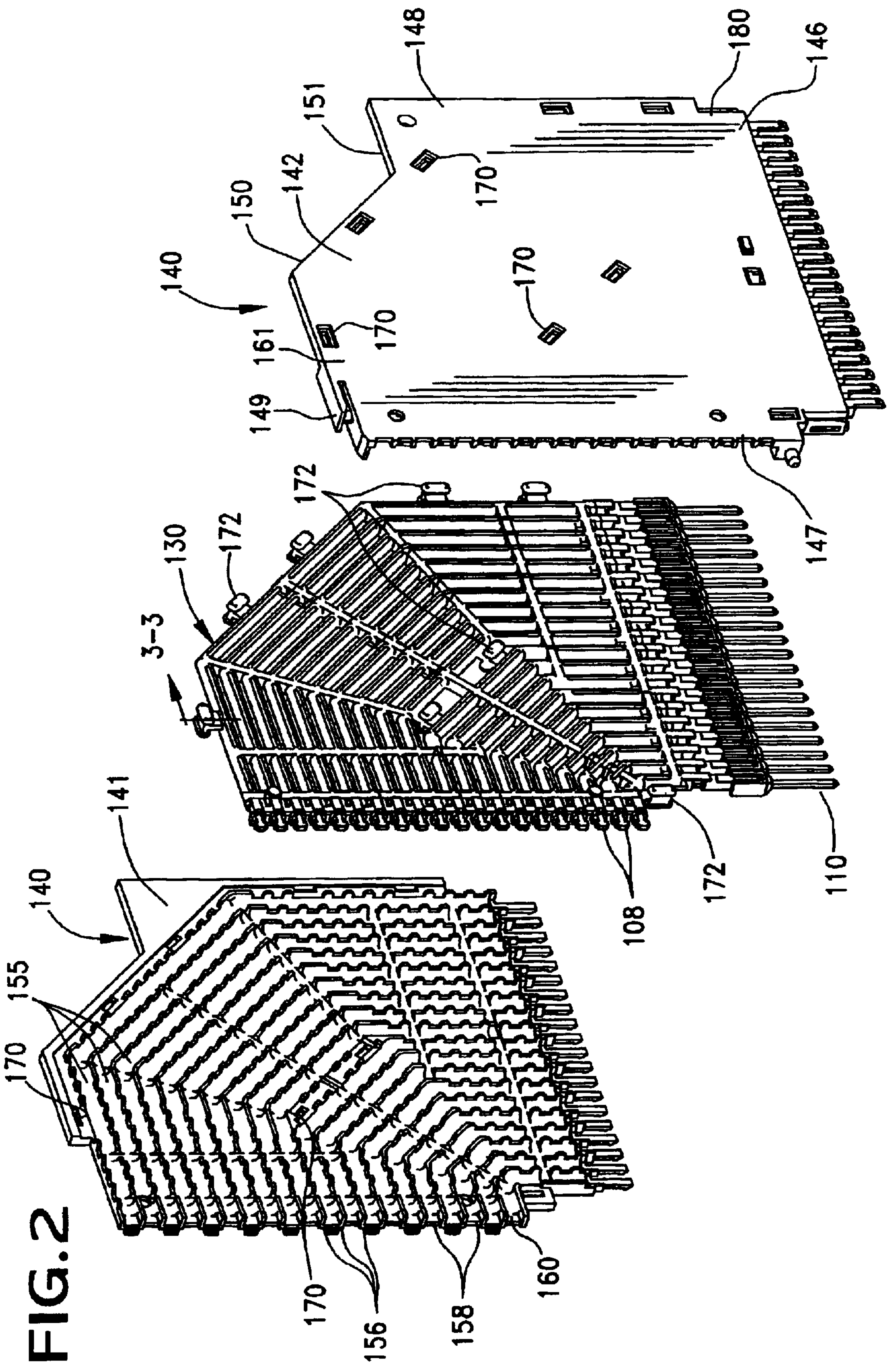
FIG. 2 is the same view as FIG. 1 but with the terminal lead frame supported in place upon its insulative skeletal support structure.

FIGS. 3 and 4 are sectioned through the wafer housing 140 and terminal assembly 130 along line 3—3 in FIG. 2 and best show one manner in which the terminal assembly 130 engages the wafer housing halves 141, 142. The housing halves 141, 142 are provided with openings 170 into which engagement lugs 172 that are formed on the terminal assembly 130. These lugs 172 preferably have blunt, enlarged heads 174 that have a dimension larger than that of the openings 170 for retention purposes. The engagement between the lugs 172 and the housing openings 170 may be a press-fit style of engagement, or a heat staked engagement or any other suitable engagement.

Figure 6:
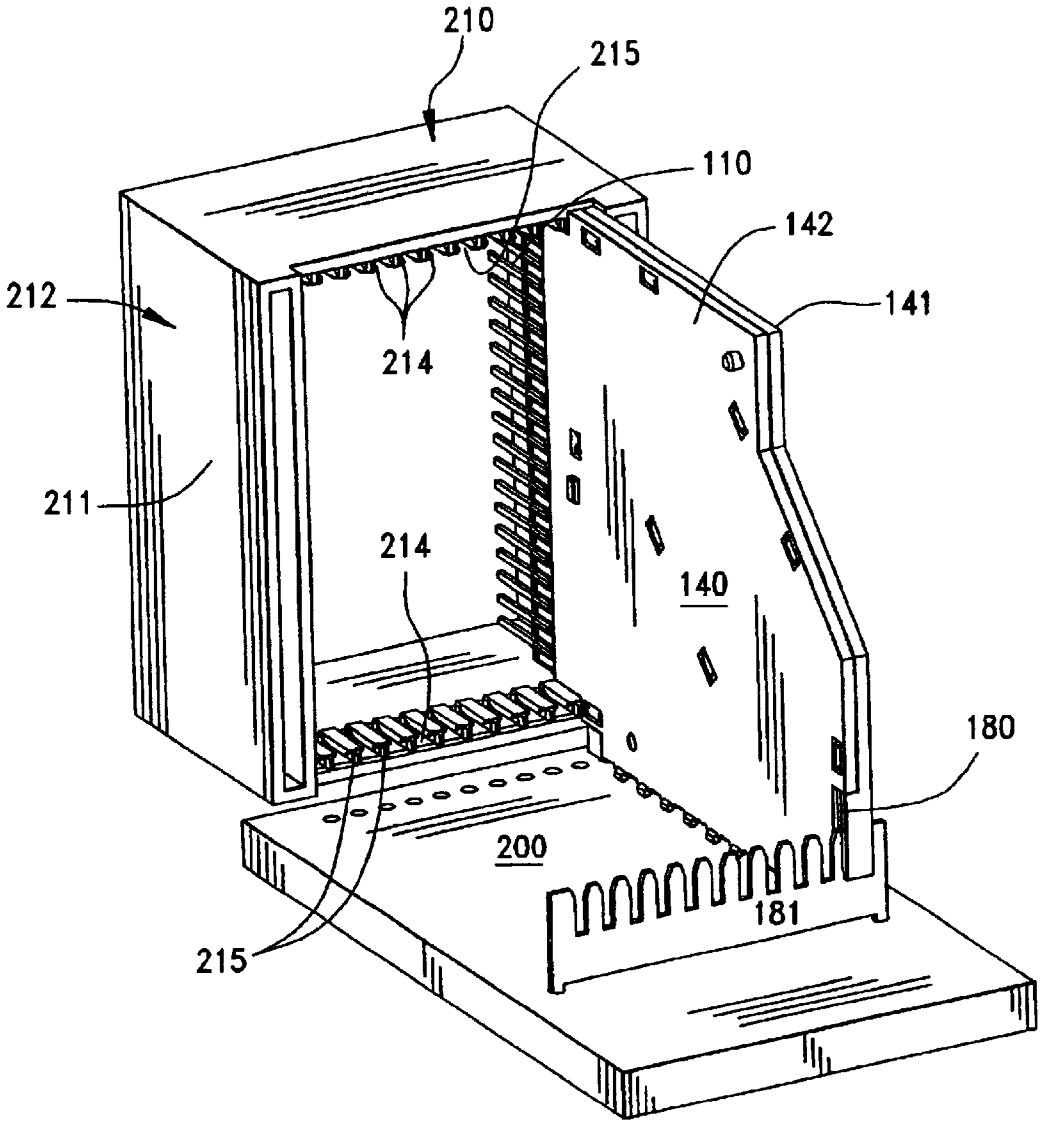
FIG. 6 is a rear perspective view illustrating a plug connector wafer mounted to a circuit board and a cover that encloses the front end of the wafer and the terminal mating portions thereof.

The rear edge 148 of the wafer housing 140 may include a slot 180 that serves to engage an alignment bar 181 that is mounted on a circuit board 200 and which serves to align the rear of the wafer housings 140 together as a unit, or block of wafer housings. (FIG. 6.) A cover member 210 in the form of a hollow, square shroud 212 may be provided to protect and to align the terminal mating portions 110 and the front edges 146 of the wafer housings 140. The cover member may include slots 214 that are separated by intervening walls 215. These slots 214 receive the bottom and top front portions of the wafer housings while the walls 215 are received within corresponding opposing slots 218 that are formed within the top and bottom front portion of the wafer housings 140.

Figure 7:
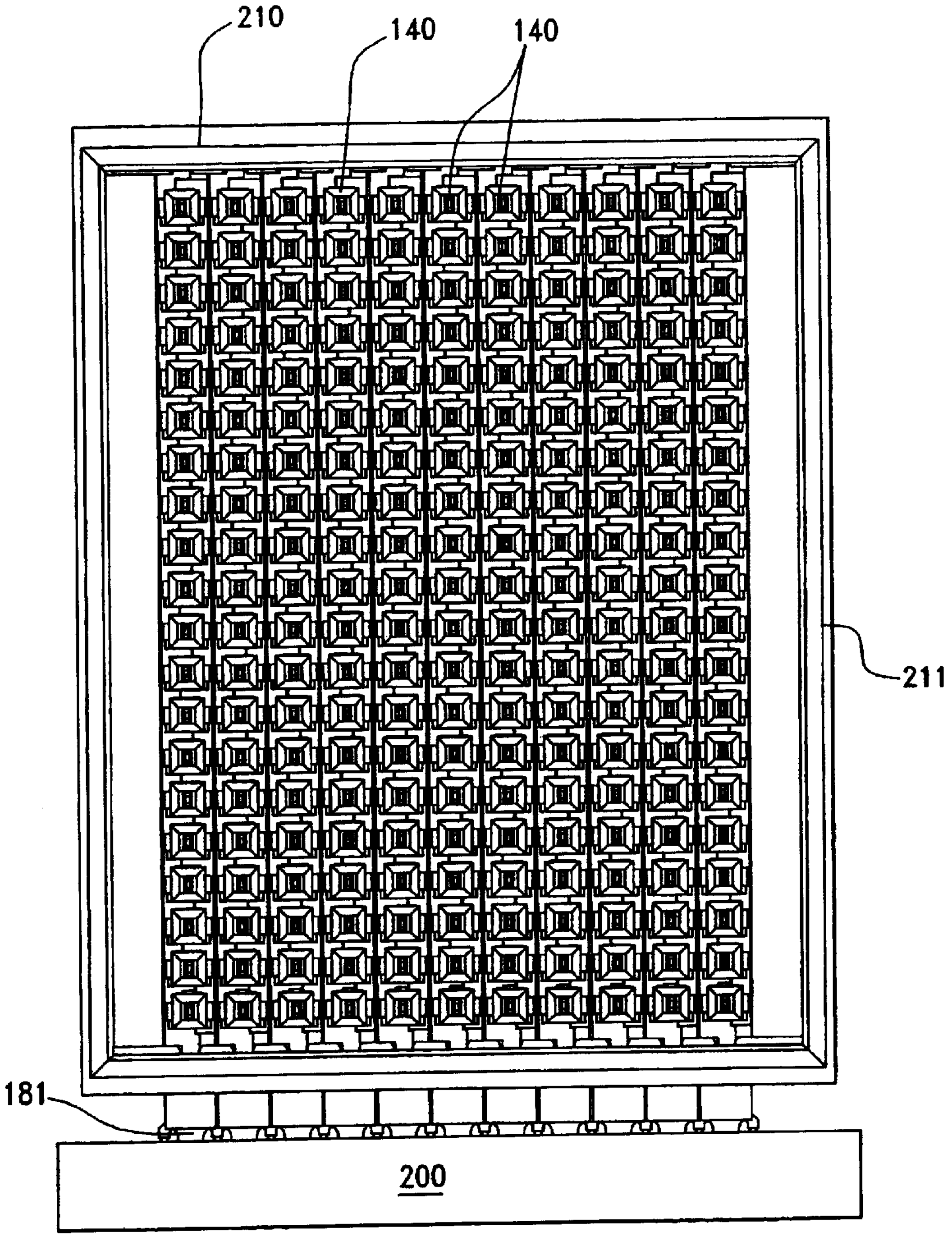
FIG. 7 is a front elevational view of the assembly of FIG. 6 with all the plug connector wafers in place within the cover and mounted to the circuit board.
Figure 12:
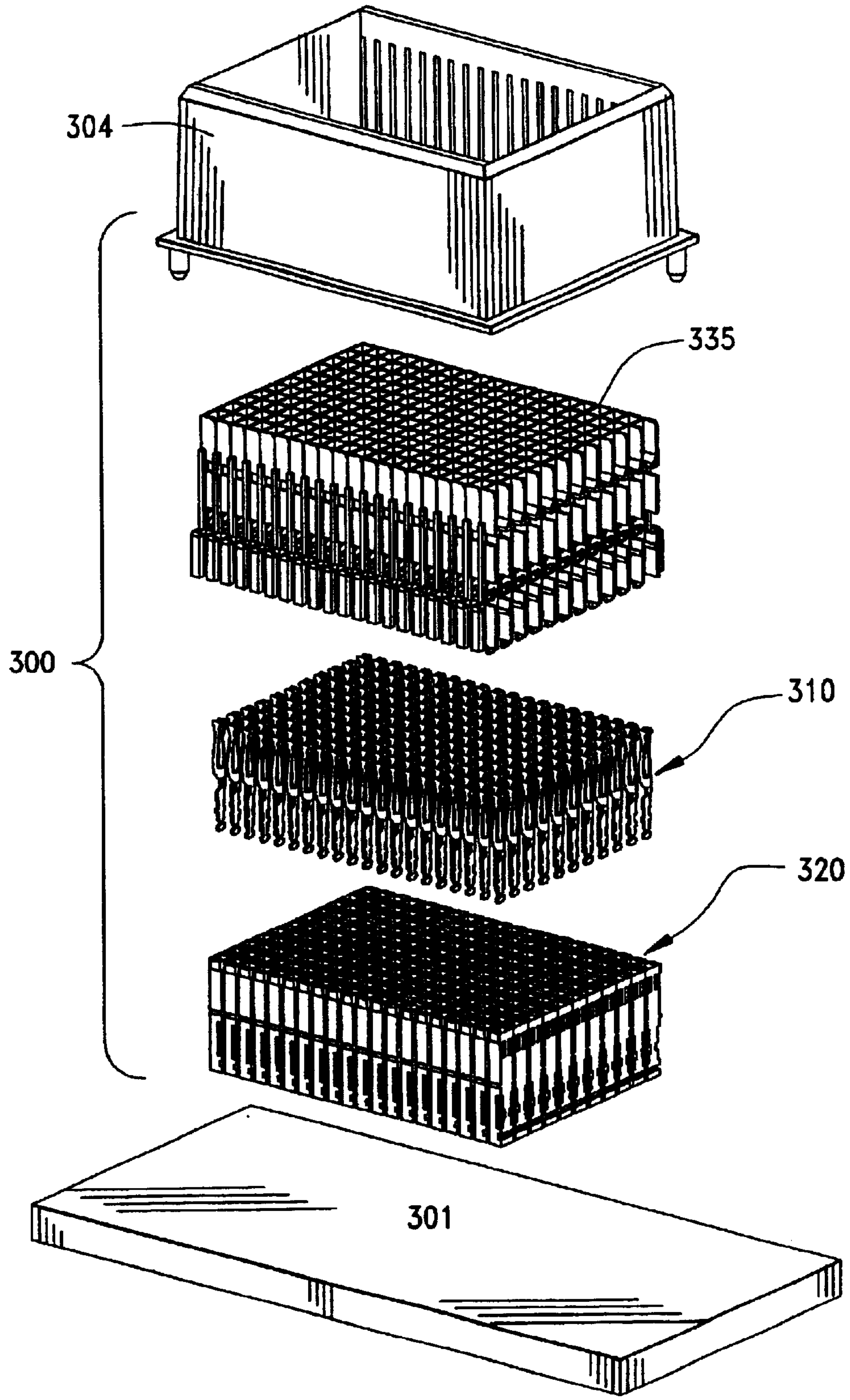
FIG. 12 is an exploded perspective view of a receptacle connector constructed in accordance with the principles of the present invention.

FIG. 7 illustrates the wafer housings 140 assembled into a block and retained within the cover member 210. The entire assembly depicted in the drawing is shown mounted to a circuit board 200. The wafer housings 140 and the overall connector assembly shown in FIGS. 1–7 is referred to as a "plug" connector component because the mating portions 110 (FIG. 5) of the terminals thereof are male mating portions that extend out from the wafer housings 140. The wafer housings 140 may be provided with means for engaging adjacent wafer housings 140, which may take the form of horizontally projecting posts 225 (FIG. 4) that are received with corresponding opposing openings 226 formed in the body portions of the wafer housing halves, 141, 142. (FIGS. 1, 4, 8, 9 & 11.) The engagement may be a press-fit style of engagement which will permit separation of the wafers from each other in order to facilitate repair and removal of selected wafers, or it may be more of a permanent nature, such as a heat-staked engagement. The wafer housings 140 may further include one or more vertical mounting posts 227 that are integrally formed with the housings 140 along their mounting edges 147 and which are received within opposing holes formed in the circuit board 200.

The mating portions 110 of the plug connector terminals are received within an opposing, receptacle connector component 300 which is illustrated in FIGS. 12–18. This receptacle connector component 300 has a cover 304 that is mounted to a circuit board 301 and due to the structure of the two connector components 100, 300, the circuit boards 200, 301 can be joined together by the connectors in an orthogonal orientation where one circuit board is perpendicular to the other circuit board. Similar to the components of the plug connector component, the terminals of the receptacle connector component are also insulated with an outer insulative cover, which in turn is surrounded by a conductive shell so as to form a structure that emulates individual coaxial cables.

Figure 13:
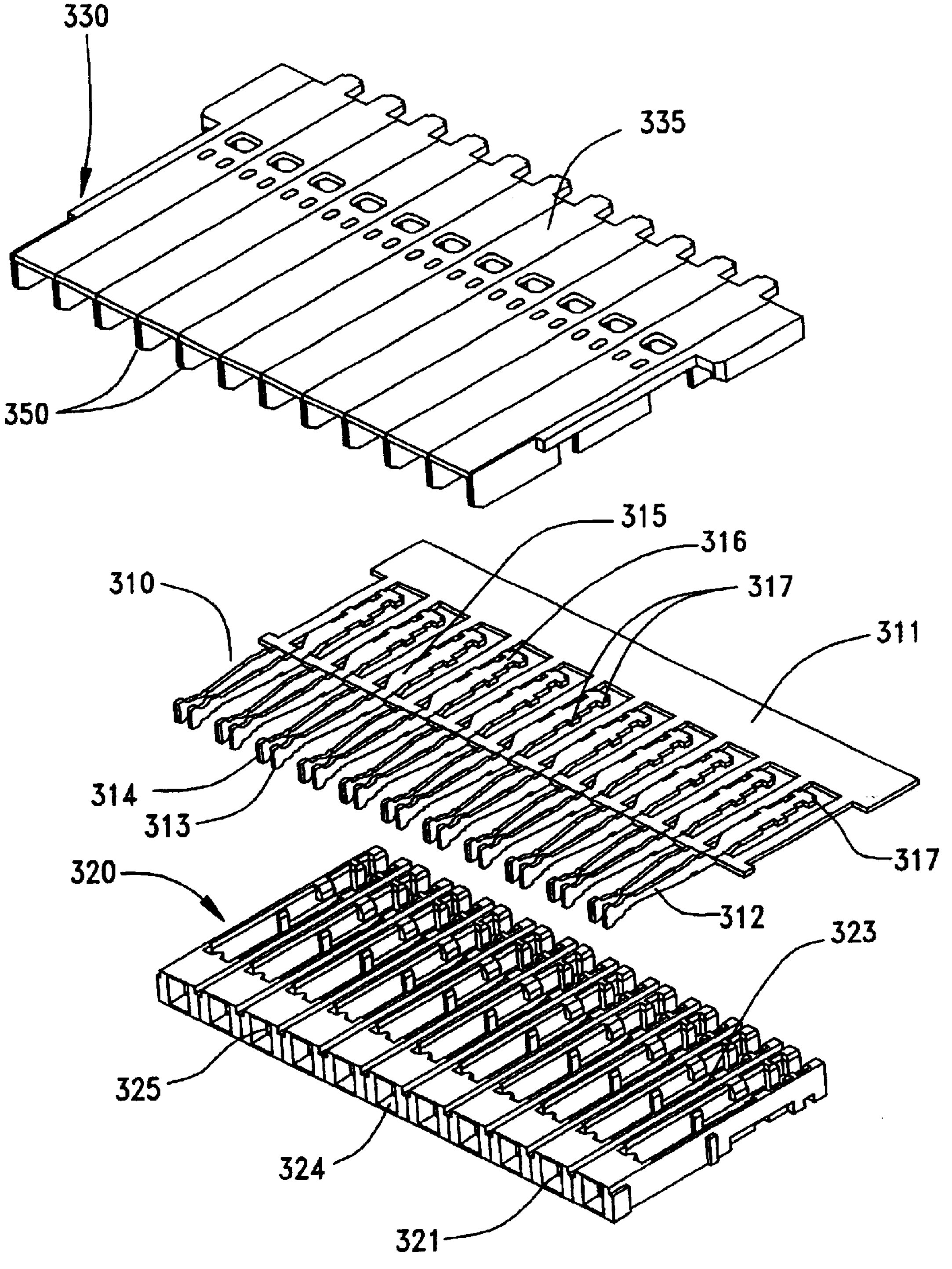
FIG. 13 is an exploded perspective view of one row of the terminal assembly of the receptacle connector of FIG. 12.
Figure 14:
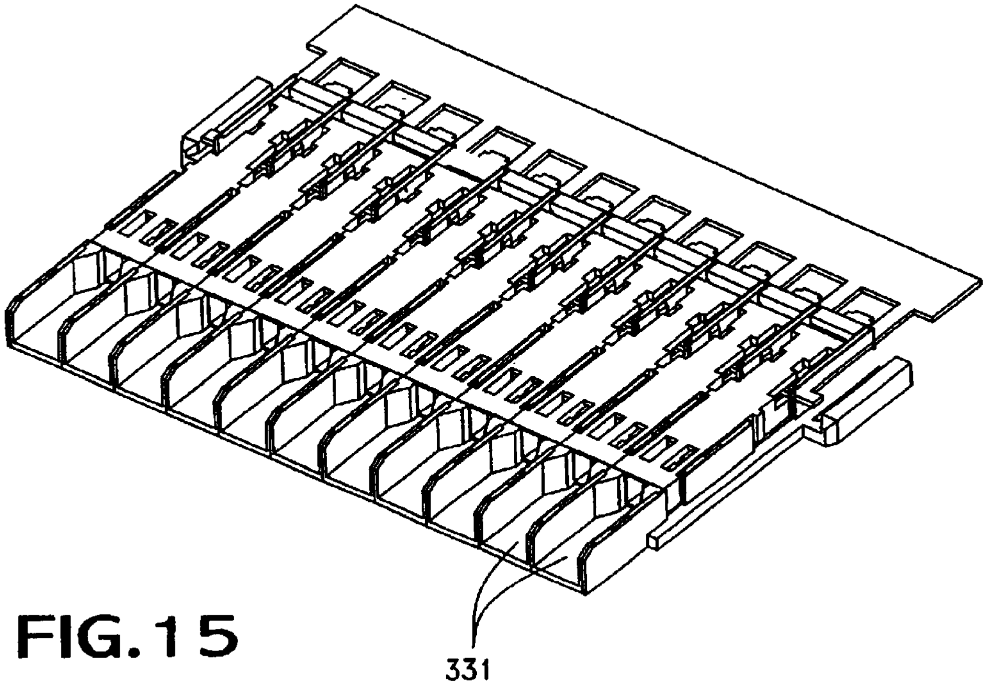
FIG. 14 is a perspective view illustrating a receptacle terminal strip mounted to an insulative housing.

Turning to FIG. 13, a series of conductive female terminals 310 are provided in side-by-side order and stamped and formed from a carrier strip 311. The terminals 310 each preferably include a mating, or contact portion, 312 that is shown as a female contact portion with a pair of opposing contact beams 313, 314 that are bent sideways from a body portion 315 and which receive the mating pins 110 of the opposing plug connector 100. Spaced apart from, but aligned with the terminal body portions 315 are tail portions that extend into openings, such as plated throughholes, or vias formed in the circuit board 301, but not shown in the drawings.

Figure 15:
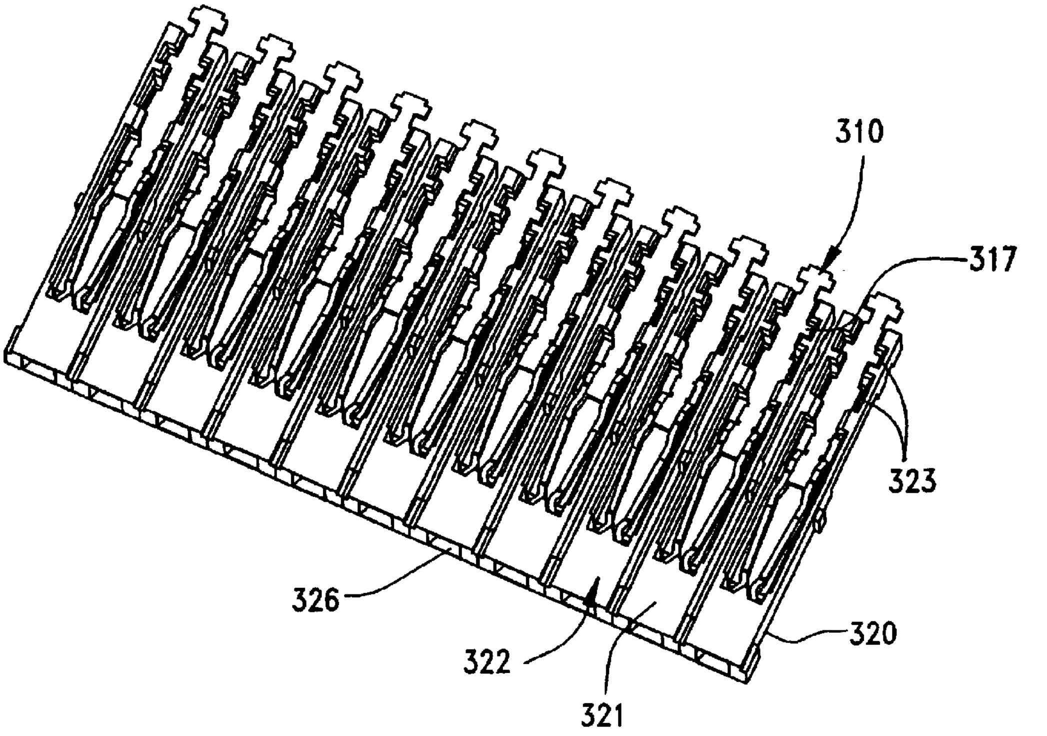
FIG. 15 is a view similar to FIG. 14 but showing the conductive terminals separated from the carrier strip.
Figure 16:
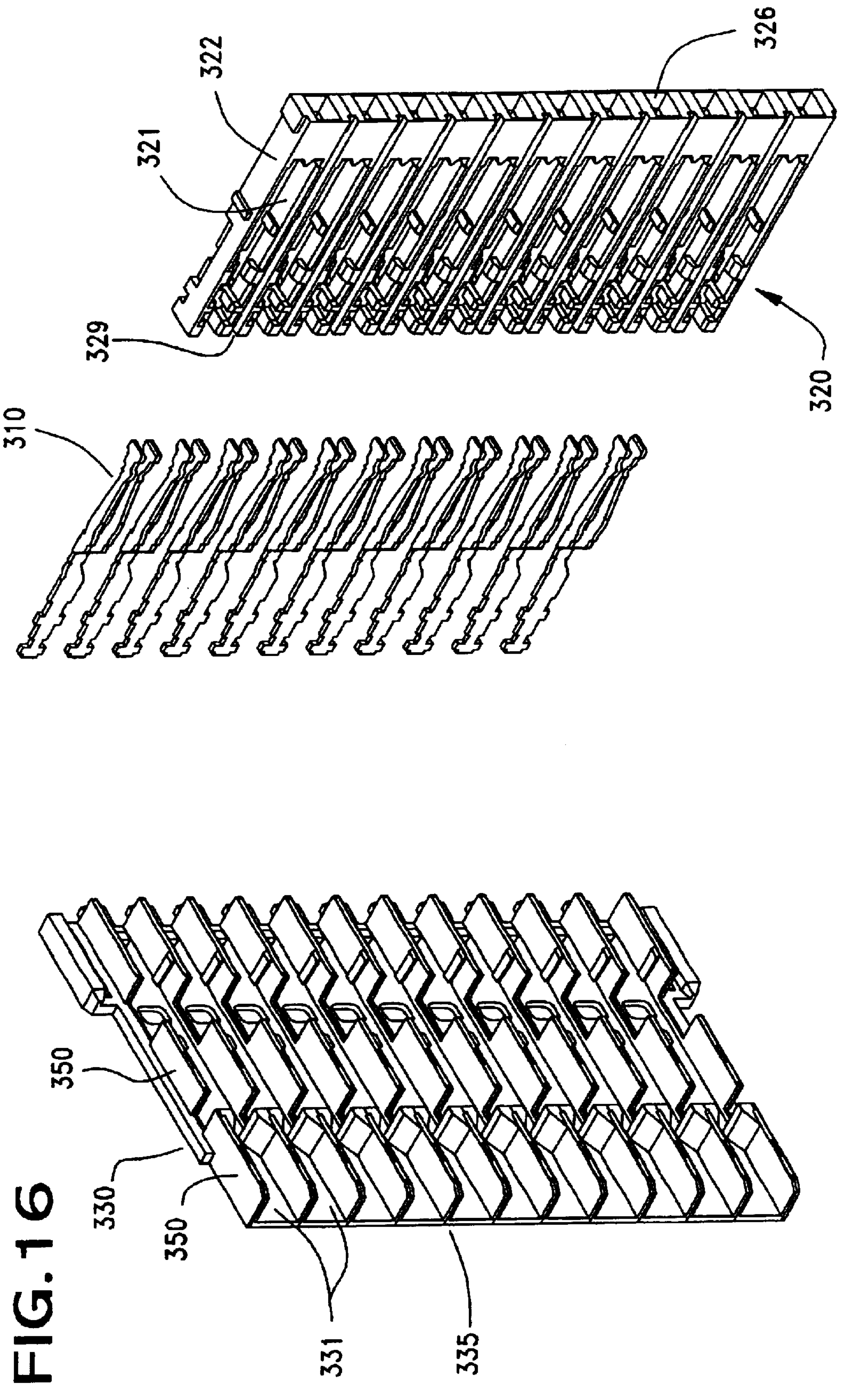
FIG. 16 is an exploded perspective view of the receptacle connector terminal assembly.
Figure 17:
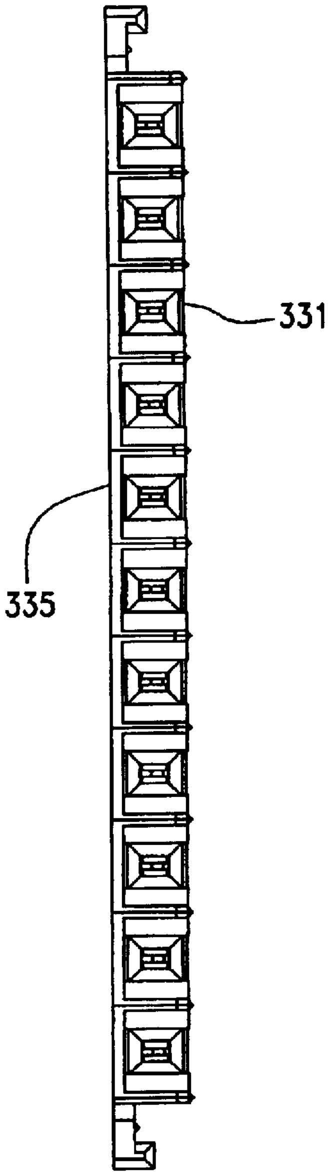
FIG. 17 is an end view of a single terminal assembly of the receptacle connector.
Figure 18:
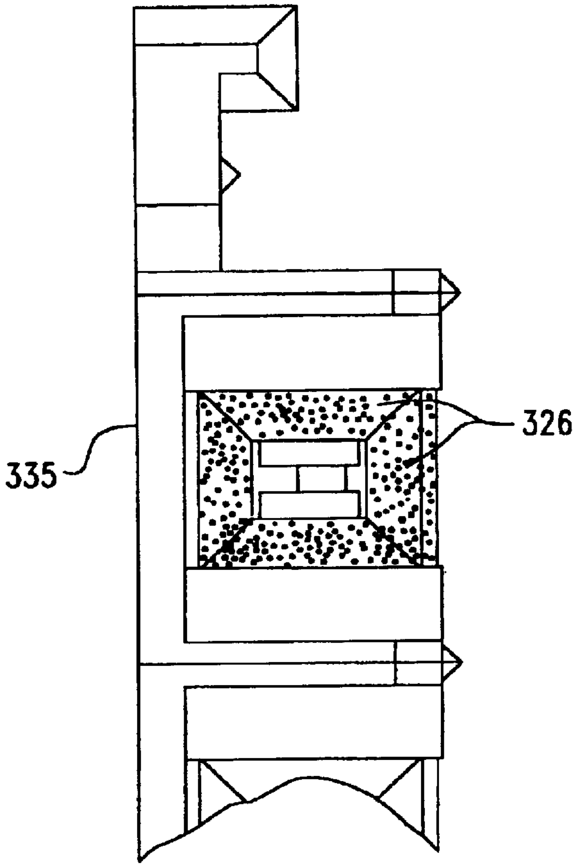
FIG. 18 is an enlarged detail view of FIG. 17 illustrating the housing-insulator-terminal structure.
Figure 20:
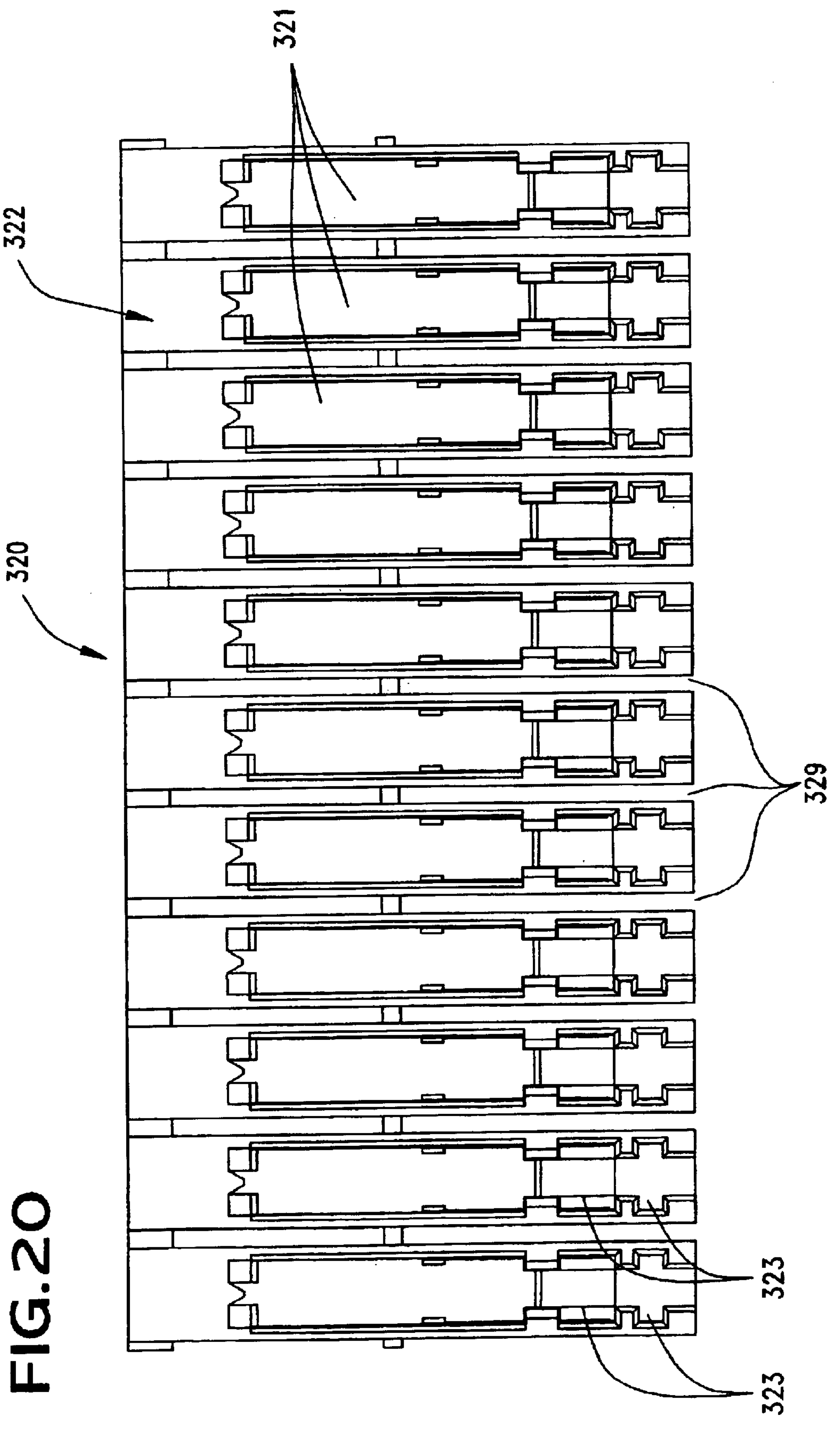
FIG. 20 is a top plan view of the insulative shell member of the receptacle connector.
Figure 21:
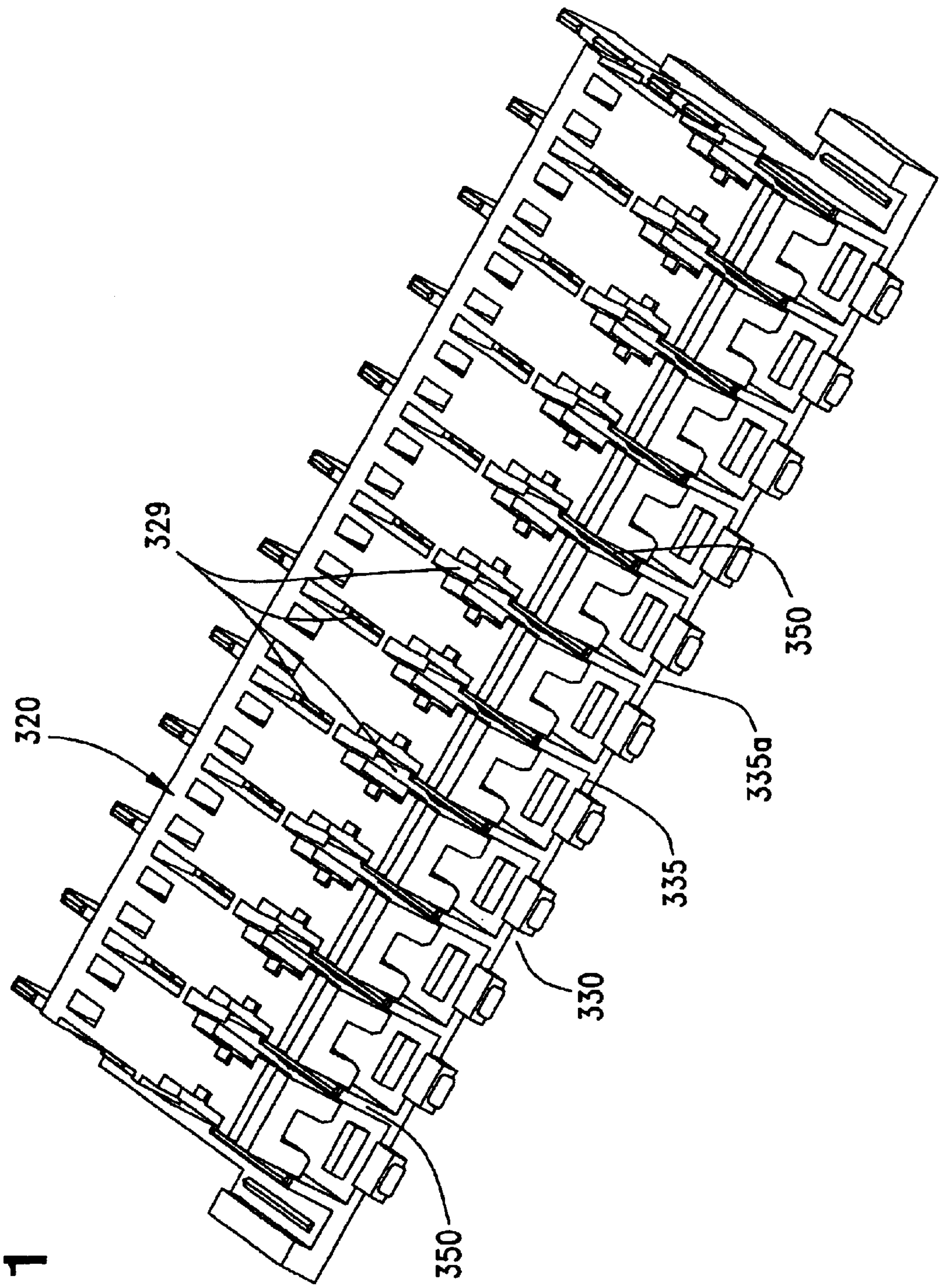
FIG. 21 is an angled view illustrating the insulative shell member of FIG. 20 partially assembled with its corresponding outer ground structure.

These terminals 310 are received with an insulative shell 320 that has, as best illustrated in FIGS. 13, 15 & 20, a plurality of terminal-receiving cavities 321 that are defined in a body portion 322 of the shell 320. Each individual cavity 321 receives a single terminal 310 therein and the cavities 321 are preferably formed with spaced-apart slots 323 that receive and hold, such as in an interference fit manner, engagement legs 317 that are formed as part of the terminals 310. Each terminal shown in the drawings has four such engagement legs 317. The front, or upper ends 324 of the insulative shell 320 are defined by four walls (as shown best in FIG. 16) to create a contact pin-receiving lead-in 325 that communicates with the contact beams 313, 314 of the terminals 310. The faces 326 of this lead-in maybe angled as is known in the art to provide surfaces that guide the free ends of the plug connector mating pins 110 into the terminal-receiving cavities 321 and into physical contact with the mating portions 312 of the receptacle terminals 310. These surfaces are shown with stippling in FIG. 18 so as to best illustrate the coaxial-like nature of the receptacle connector component as will be explained in greater detail below, with the stippled area identifying the insulative shell member 320.

The terminals 310 are assembled into their insulative shell 320 and that structure, in turn is assembled into an outer ground structure 330 that is formed with a plurality of passages, in the form of channels 331, each of which receives a corresponding terminal and cavity portion of the shell 320. The ground structure 330 is made conductive also by plating or otherwise coating its exterior surfaces with a conductive material such as a metal. The ground structure 330 provides a reference ground to at least three sides of each of the terminals 310 which are contained in the insulative shell member 320, and the fourth side is closed off with a ground in the form of the backside 335*a* of the base wall 335 of an adjacent ground structure 330 when the wafers are assembled together as a unit as shown in FIG. 7. This ground structure 330 has a plurality of walls 350 that extend up from the base wall 335. These walls 350 are received within corresponding opposing slots 329 that are formed in the insulative shell member 320 and the slots serve to at least partially define separate housings for each terminal of the receptacle connector.

It can be seen that both of the connector components provide a pseudo-coaxial structure in which conductive terminals and first surrounded by an insulative support or shell and then are encompassed by conductive grounds. In this manner the reference ground is maintained in proximity to the inner terminals through the mating interface of the two connector components and through the connector components to the circuit boards to which they are mounted, thus providing for better signal isolation and higher transmission speeds.

Figure 19:
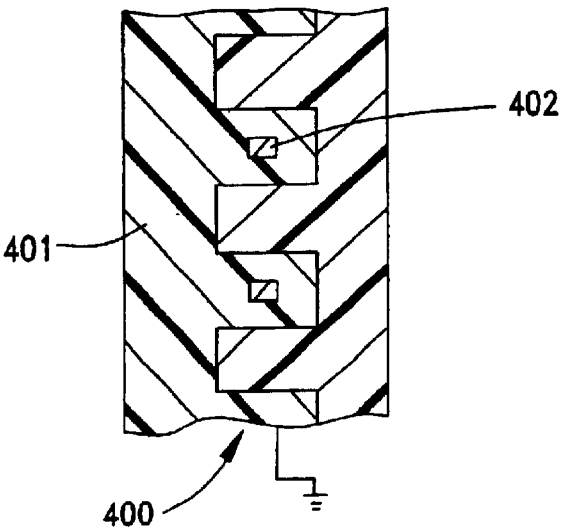
FIG. 19 is a sectional view of an alternate embodiment of a two-part wafer housing.

FIG. 19 illustrates an alternate embodiment of a wafer housing structure 400. In this embodiment, one wafer housing half 401 is molded over a set of conductive terminals 402. This housing half is formed from a dielectric material. A second housing half 403 is molded and is plated or otherwise covered with a conductive material. This conductive material gives it the properties of a grounding shield. The two housing halves 401, 403 are formed with alternating and interfitting valleys and lands which interfit with each other in the manner shown in FIG. 19.

Figure 22:
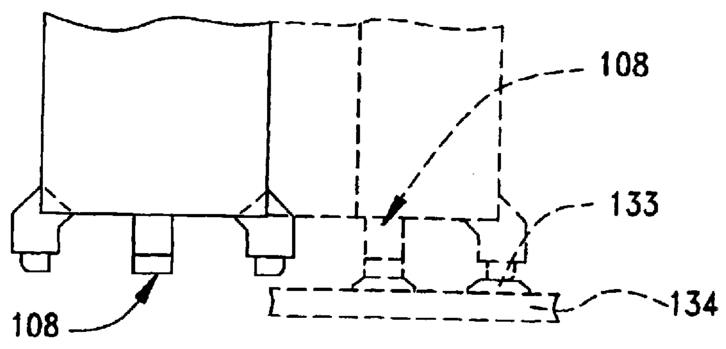
FIG. 22 is an enlarged detailed, end view of the bottom of the wafer illustrated in FIG. 3, showing the projection of the surface mount feet of the wafer ground structure and with a second wafer shown in phantom immediately adjacent thereto.
Figure 23:
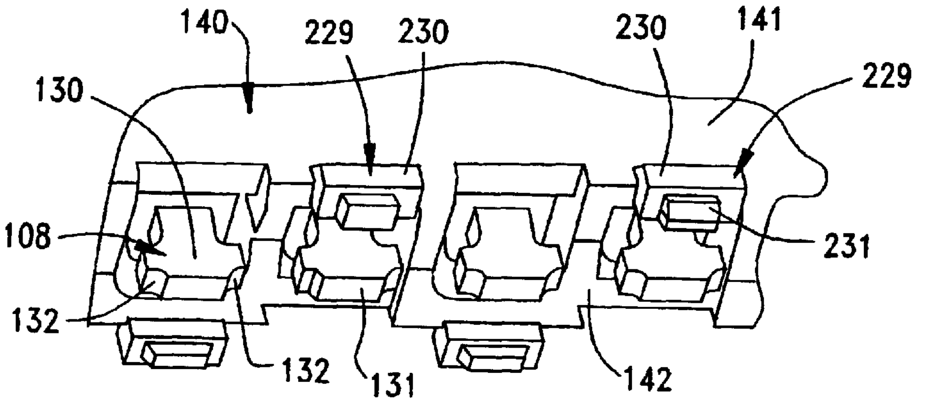
FIG. 23 is an angled perspective, taken from the bottom of the wafer of FIG. 4, illustrating the arrangement of the terminal surface mount feet and the eafer surface mount feet; and, FIG. 24 is a bottom plan view of a section of a pair of wafer arranged in side-by-side order.

In another aspect of the present invention, the connectors are provided with a unique tail structure. As shown generally FIGS. 4 & 5, the tail portions 108 of the terminals 104 have a blunt body portion 130 that extends generally transversely to the axes of the terminals 102, and in this case, generally parallel to the plane of the surface of a circuit board to which it is mounted. A mounting stub 131 is provided that projects from the body portion 130 an is shown projecting downwardly in FIG. 5. The tail 108 may be considered as having a pair of re-entrant portions, or notches 132. This stub portion enters a mass of solder paste 133 that is deposited on contact pads of a circuit board 134 as shown best in FIG. 22, and the re-entrant portions 132 promote the wicking, or movement of the solder paste 133 up and around the terminal tail body portion 130 to thereby establish a reliable solder joint.

The ground structure 140 has similar surface mounting tails 229 formed as part of the housing halves 141, 142 and each such tail has a relatively wide body portion 230 that, as shown in FIGS. 3 and 4 extends outwardly with respect to the sides of the housing halves 141, 142. A narrow mounting stub 231 is formed with each such plastic, conductively-coated tail 229 and also pierces into the mass of solder paste 133 that is deposited on the contact pad of the circuit board 134 (FIG. 22) to which the connector assembly is attached. The use of the difference in thickness between the body portion and the mounting portion defines a re-entrant or notched area that promotes wicking or capillary movement of the liquid solder during a reflow attachment operation.

Figure 24:
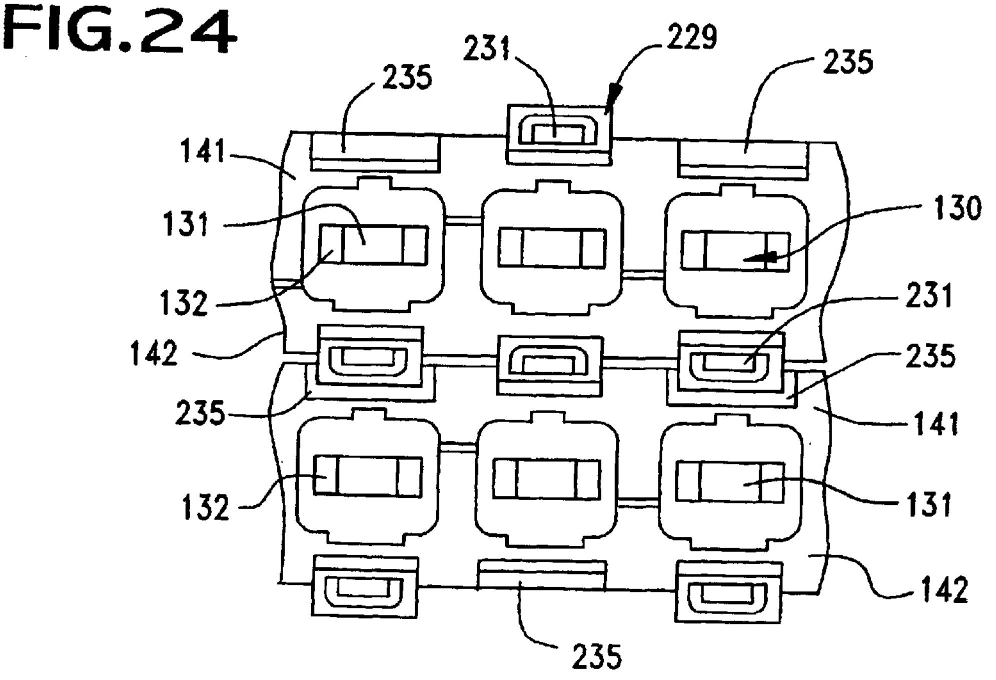

Additionally, the terminal surface mounting feet or tail portions 108 are preferably aligned with each other longitudinally along the bottom of the mounting surface or the connector assembly. The surface mounting feet or tails 229 of the wafer housings, or ground structure are arranged, as shown best in FIG. 24 in two lines that also extend longitudinally along the bottom mounting surface and these two lines, as illustrated, preferably flank the terminal mounting feet 108. The wafer surface mount tails 229, as shown in FIG. 3, extend out from the sides of the wafer housing halves 141, 142 and are separated from each other along the outer edges of the wafer mounting surface by intervening recesses 235. These recesses 235, as illustrated in FIG. 24, accommodate the projecting surface mount tails or feet 229 of adjacent wafers, thereby increasing the density at which the wafers of the connectors of the present invention may be assembled.

While the preferred embodiment of the invention have been shown and described, it will be apparent to those skilled in the art that changes and modifications may be made therein without departing from the spirit of the invention, the scope of which is defined by the appended claims.

We claim:

1. A high-density connector assembly comprising:

a plurality of individual terminal assemblies, each terminal assembly having a plurality of signal terminal disposed therein in a signal terminal array;

each of the signal terminals including a contact portion for mating with an opposing connector, a tail portion for connecting to a circuit board and a body portion interconnecting the contact and tail portions together, the terminal body portions being supported within an insulative frame; and, a conductive ground structure that encompasses said signal terminals and which supports the frame, the ground structure including at least a pair of interengaging housing halves having a plurality of grooves formed in opposing faces thereof, the grooves supporting said frame in place between said housing halves such that each of the grooves receives a single terminal therein.

2. The connector assembly of claim 1, wherein said frame includes at least one T-shaped engagement lug that is received within a corresponding opposing of one of said housing halves, the engagement lug having a head extending transverse to said terminal longitudinal axes, the head retaining the engagement lug in place with said housing halve opening.

3. The connector assembly of claim 1, wherein said housing halves and frame cooperatively define a wafer member, and said connector assembly includes a cover member into which said wafer members fit, and said ground structure further includes means for engaging an alignment bar for aligning said wafer members together.

4. The connector assembly of claim 1, wherein said terminal tail portions include surface mounting feet for mounting to a circuit board, the surface mounting feet including body portions with narrow mating portions projections therefrom, the surface mounting feet including re-entrant portions where the narrow mating projections extend from the body portions that promote wicking of solder onto said surface mounting feet.

5. The connector assembly of claim 1, wherein said frame includes at least one engagement member formed thereon which engages at least one of said housing halves to position said frame within said ground structure.

6. The connector assembly of claim 5, wherein said ground structure includes at least one opening formed therein that receives the at least one engagement member of said frame.

7. The connector assembly of claim 1, wherein said ground structure includes a plurality of tail portions arranged along opposing edges of a mounting face of said ground structure, the ground structure tail portions including surface mounting feet having wide body portions and narrow contact portions extending therefrom, the difference in size between said narrow contact portions and the wide body portions promoting wicking of solder onto the ground structure surface mounting feet.

8. The connector assembly of claim 7, wherein said ground structure further includes a plurality of recesses disposed along opposing edges of the ground structure mounting face and interposed between said ground structure tail portions.

9. The connector assembly of claim 8, wherein the recesses of one ground structure receive said tail portions of an adjacent ground structure when said ground structure and adjacent ground structure are mounted to a circuit board.

10. The connector assembly of claim 1, wherein said frame is molded over portions of each of said terminals.

11. The connector assembly of claim 10, wherein said frame includes slots formed longitudinally therein arranged along axes of at least some of said terminals exposing portions of said terminals to air.

12. The connector assembly of claim 11, wherein said ground structure housing halves include interior face portions that oppose each other and surround said frame, the interior face portions being plated with a conductive material.

13. The connector assembly of claim 12, wherein said ground structure grooves are sized to provide an air gap between said frame and said ground structure housing halves.

14. The connector assembly of claim 11, wherein said ground structure includes means for holding said ground structure housing halves together as a single component, said ground structure housing halves being plated with a conductive material and said ground structure housing halves including tail portions for connecting to at least one ground circuit disposed on a circuit board to which said connector assembly is mounted, such that said ground structure housing halves provides a common ground for each of said terminals held by said frame.

15. The connector assembly of claim 11, wherein said slots are arranged in said frame to divide portions of said frame into distinct top and bottom portions.

16. A connector, comprising:

a plurality of conductive terminals having contact portions for mating with terminals of an opposing connector and tail portions for mounting to a circuit board;

an insulative shell member supporting the terminals, the shell member including a body portion having a plurality of walls formed thereon, the walls and body portion cooperatively forming a plurality of insulative terminal-receiving channels formed therein, each of the channels receiving a single terminal therein, each of said channels further including an opening at one end for receiving a contact portion of a terminal from the opposing connector, said shell member further including a plurality of spaced-apart slots disposed therein, the slots partially separating adjacent channels; and, a conductive shield member that is engageable with said shell member, the shield member including a base with a plurality of spaced-apart walls disposed thereon, the walls being received within said shell member slots such that said shield member base and walls define at least three conductive members that are located on three distinct sides of said channel in order to partially surround channels that extend along at least three sides of said terminals within said body channels.

17. The connector of claim 16, further including a plurality of insulative shell members and shield members assembled together, the assembled shell and shield members being received within an outer hollow cover.

18. A connector comprising:

a plurality of individual terminal assemblies, each terminal assembly having a plurality of signal terminal disposed therein in a signal terminal array, each signal terminal including a contact portion for mating with an opposing connector, a tail portion for connecting to a circuit board and a body portion interconnecting the contact and tail portions together, the terminal body portions being supported within an insulative frame;

the terminal tail portions including wide body portions for surface mounting said terminals to a circuit board, the tail wide body portion including narrow contact portions that extend out therefrom into contact with solder on a circuit board when said connector is mounted to the circuit board, the difference in dimensions between said wide body and narrow contact portions defining notches that promote wicking of solder onto said tail wide body portions; and, a conductive ground structure that encompasses said signal terminals and which supports the frame, the ground structure including at least a pair of interengaging housing halves having said frame and terminals in place therebetween, the ground structure including a plurality of surface mount tail portions arranged along opposing edges of a mounting face of said ground structure, the ground structure surface mount tail portions also including having wide body portions and narrow contact portions extending therefrom, the difference in size between said narrow contact portions and the wide body portions promoting wicking of solder onto the ground structure surface mount tail portions.

19. The connector of claim 18, wherein said ground structure further includes a plurality of recesses disposed along opposing edges of the ground structure mounting face and interposed between said ground structure surface mount tail portions.

20. The connector of claim 19, wherein the recesses of one ground structure receive said tail portions of an adjacent ground structure when said ground structure and adjacent ground structure are mounted to a circuit board.

* * * * *